United States Patent
Muradali

(10) Patent No.: US 7,626,412 B2
(45) Date of Patent: Dec. 1, 2009

(54) ADAPTIVE TEST TIME REDUCTION FOR WAFER-LEVEL TESTING

(75) Inventor: Fidel Muradali, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 246 days.

(21) Appl. No.: 11/899,264

(22) Filed: Sep. 5, 2007

(65) Prior Publication Data

US 2009/0058451 A1    Mar. 5, 2009

(51) Int. Cl.
*G01R 31/26* (2006.01)
(52) U.S. Cl. ...................................... 324/765
(58) Field of Classification Search ............ 324/765, 324/158.1, 754, 761–762; 257/48; 438/14–18; 702/119, 108
See application file for complete search history.

(56) References Cited

U.S. PATENT DOCUMENTS

| 6,853,206 B2 * | 2/2005 | Hubner et al. ............... 324/754 |
| 7,165,004 B2 * | 1/2007 | Dorough et al. ............. 702/119 |

* cited by examiner

*Primary Examiner*—Ha Tran T Nguyen
*Assistant Examiner*—Tung X Nguyen
(74) *Attorney, Agent, or Firm*—Dergosits & Noah LLP

(57) ABSTRACT

A method is provided for dynamically increasing or decreasing the amount of test data that is applied to die locations on a wafer under test. As on-wafer locations are traversed and tested, the amount of test stimuli applied to subsequent locations is adjusted. This adjustment is based upon the results of previously tested locations. The effect is that the test program detects regions of the wafer that are more likely to fail and applies more complete testing to these areas. Other areas of the wafer may receive reduced testing. By automatically adapting the test mix to suit the potential failure patterns, wafer testing time is reduced.

4 Claims, 3 Drawing Sheets

HIGHER LIKELIHOOD OF DEFECTS OR FAILURES SO FORCE FULL TEST AT THESE REGIONS

VARIATION: FAILURE OCCURRED AT SKIP TEST-SITE. RE-TEST WITH THE FULL TEST SET

ADAPTIVE TEST TIME REDUCTION FOR WAFER-LEVEL TESTING

FIELD OF THE INVENTION

The present invention relates to the testing of semiconductor integrated circuits and, in particular, to a technique for reducing wafer level test time by detecting regions on a wafer where failure mechanisms occur and then automatically adjusting the test mix to suit.

DISCUSSION OF THE RELATED ART

As is well known, a processed wafer contains a set of semiconductor integrated circuit die that are typically arranged in some form of physical 2-dimensional grid. During testing, the wafer die locations are sequentially and linearly traversed. This is done on a per-row or per-column basis. As discussed herein, indexing is assumed to be on a per-row basis. Via the test program, a test set is applied to the die locations being traversed and responses are analyzed.

DEFINITION OF TERMS

As used herein, the following terms shall have the stated meaning.

Single Site Testing: a single location is tested before the wafer is further traversed (or "indexed")

Multi-site Testing: multiple die locations are tested before the wafer is further traversed (or "indexed")

Probe Site: the single or collection of die locations being tested before the wafer is further traversed (or "indexed")

Full-Test: application of the complete (Full) set of test stimuli to the members of a Probe Site Skip-Test: application of a reduced test to the members of a Probe Site, i.e., some tests are "skipped" at that site Skip Test Limit: the default number of consecutive Probe Sites to which Skip test is applied before Full test must be resumed Full Test Limit: the default number of consecutive Probe Sites to which Full test is applied before Skip Test can begin Pass Limit: after detecting a failing die, the number of consecutive Probe Sites that must pass Full test before Skip test may resume

SUMMARY OF THE INVENTION

Conventionally, a set of test stimuli is applied to each die location on a wafer. The present invention provides a method for dynamically increasing or decreasing the amount of test data that is applied to die locations to be tested. As on-wafer locations are traversed and tested, the amount of the test stimuli applied to subsequent locations is adjusted based upon the results of previously tested locations. The effect is that the test program detects regions of the wafer that are more likely to fail and applies more complete testing to these areas. Other areas may receive reduced testing.

The features and advantages of the various aspects of the present invention will be more fully understood and appreciated upon consideration of the following detailed description of the invention and the accompanying drawings, which set forth illustrative embodiments in which the principles of the invention are utilized.

DETAILED DESCRIPTION OF THE INVENTION

In accordance with the present invention, a default sequence of Full Test and Skip Test are applied to consecutively indexed sites, e.g. consecutively indexed integrated circuit die, on a semiconductor wafer. That is, in the case of a wafer that includes an array of rows and columns of individual integrated circuit die, starting from the beginning of a new row, Full Test is applied to a user-defined number (Full Test Limit) of consecutive die; Skip Test is then applied to another user-defined number (Skip Test Limit) of consecutive die. If a failing location is detected, then Full Test is applied to the subsequent indexed die until a user defined number (Pass Limit) of die consecutively pass. When this condition is satisfied, the Full/Skip Test sequence resumes starting at Skip Test. The default Full/Skip Test sequence restarts each time that wafer indexing begins on a new row. At predetermined wafer locations, the method of applying a sequence of Full Test and Skip Test as define above can be over-ridden. At these locations, Full Test or a specific test set may be asserted. The method restarts upon exiting these predetermined regions.

Figure 1A:
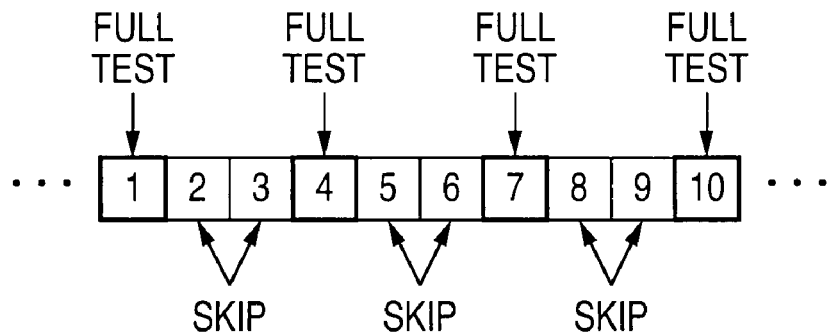
FIG. 1A illustrates single site testing utilizing a default Full/Skip test sequence in accordance with the present invention.
Figure 1B:
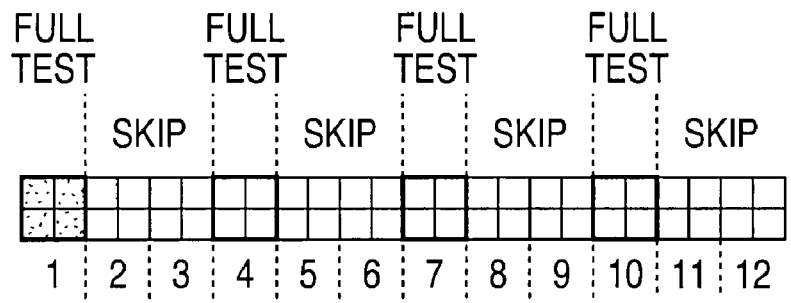
FIG. 1B illustrates multi-site testing utilizing a default Full/Skip test sequence in accordance with the present invention.

FIGS. 1A and 1B show testing in accordance with the invention with a default Full/Skip test sequence of one Full test site followed by two Skip Test sites before repeating the sequence. That is, Full Test Limit=1 and Skip Test Limit=2. FIG. 1A shows ten sites and Single Site Testing. FIG. 1B shows Multi-Site Testing; each probe site is a collection of 4 dice; twelve probe sites are shown.

FIGS. 2 and 3 illustrate the method of the invention in the presence of defective sites. The Pass Limit=3 and the default Full/Skip test sequence is as in FIGS. 1A and 1B.

Figure 2A:
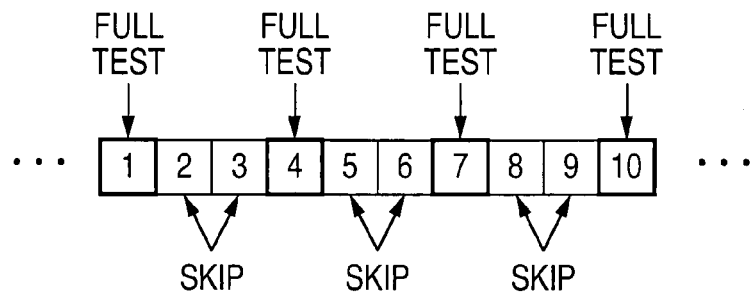
FIGS. 2A-2D illustrates a single site testing sequence in accordance with the present invention in the presence of defective sites.
Figure 2B:
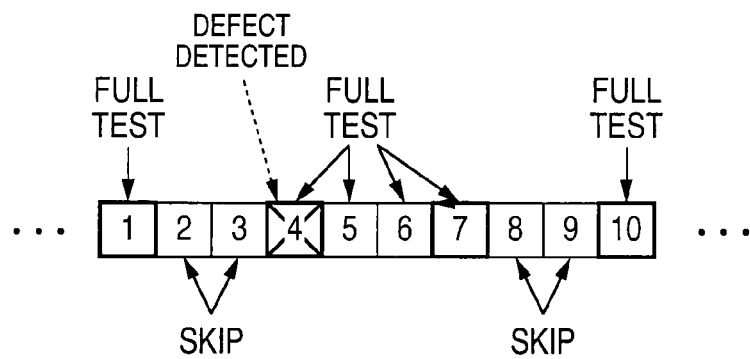
Figure 2C:
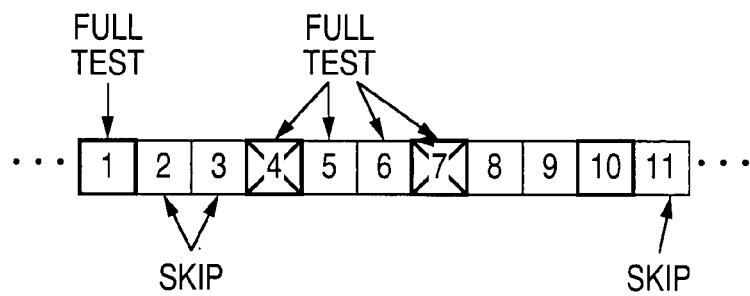
Figure 2D:
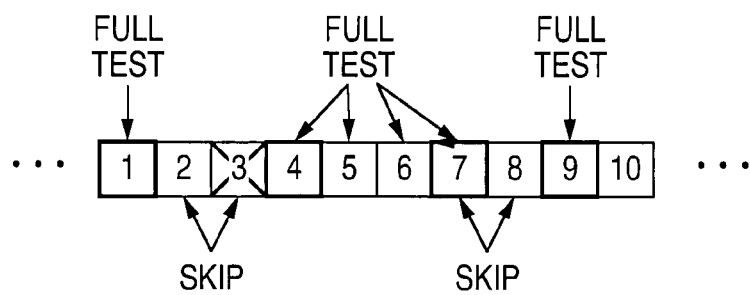

FIG. 2A shows the default sequence for Single Site Testing (repeated from FIG. 1A). In FIG. 2B, a defect is detected at site #4. Subsequent sites are Full Tested until three consecutive sites pass. In this case, sites #5, #6 and #7 pass. Thus, Skip Testing resumes at site #8. As there are no other defects, according to the default Full/Skip sequence, sites #8 and #9 are Skip Tested and site #10 is Full Tested. In FIG. 2C, as in FIG. 2B, a defect is detected at site #4. Full Testing is forced until three consecutive passes, i.e. at sites #8, #9 and #10 occur. Skip Testing resumes at site #11. FIG. 2D is similar to FIG. 2B except that the first defect is detected at site #3.

Figure 3A:
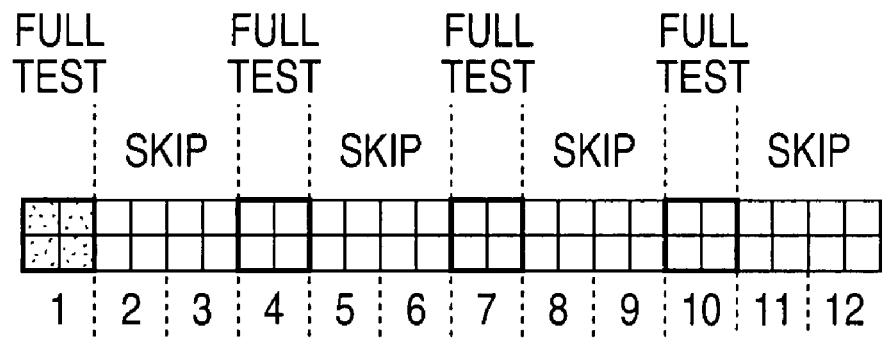
FIGS. 3A-3C illustrates a multi-site testing sequence in accordance with the present invention in the presence of defective sites.
Figure 3B:
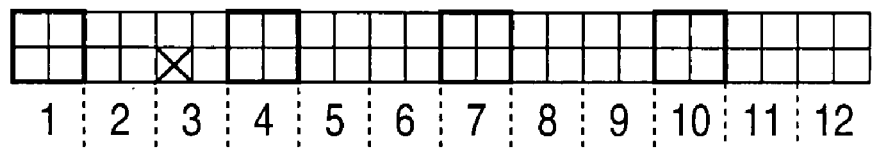
Figure 3C:
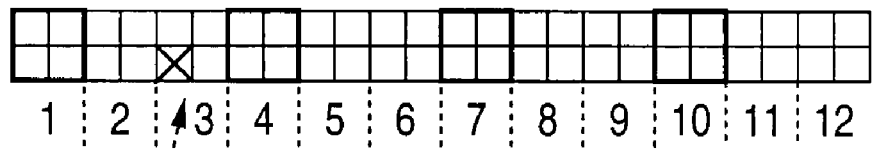

FIG. 3A shows the default sequence for Multi-Site Testing (repeated from FIG. 1B). In FIG. 3B, a failing die is detected at a member of Probe Site #3. Subsequent sites are forced to Full Test until three consecutive probe sites, in this case sites #4, #5 and #6, pass. The default Full/Skip sequence then resumes. FIG. 3C shows a variation of the method for the example of FIG. 3B in which the failure occurred while Skip testing site #3. Before proceeding to site #4, site #3 is re-tested with the complete test set (Full Test). This more thoroughly checks the previously passing members of site #3.

Figure 4:
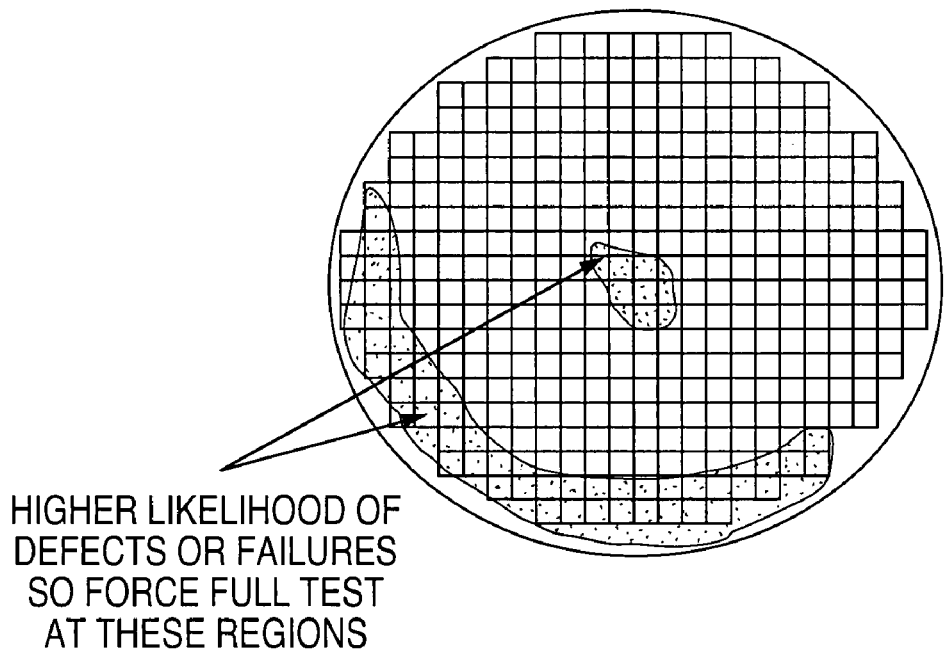
FIG. 4 illustrates a wafer having areas having a higher likelihood of defective sites.

FIG. 4 shows that it is possible to determine regions of the wafer that are more susceptible to failure. Full test can be forced to occur in these areas. For example, die locations a specific distance from the edge of the wafer, or die locations near the center of the wafer, may be forced to Full Test. That is, the test program overrides the "normal" method in these wafer regions.

It should be understood that the particular embodiments of the invention described above have been provided by way of example and that other modifications may occur to those skilled in the art without departing from the scope and spirit of the invention as express in the appended claims and their equivalents.

What is claimed is:

1. A method of testing a plurality of consecutively indexed wafer sites on a semiconductor wafer that includes a plurality of integrated circuit die formed thereon, the wafer sites being arranged as an array of rows and columns of such wafer sites, the method comprising:

for each row of consecutively indexed wafer sites,
(a) beginning with the first wafer site in said row, applying a complete set of test stimuli to a first predefined number of consecutive wafer sites in said row;
(b) in the event that a defective wafer site is not identified in the first predefined number of consecutive wafer sites, applying a reduced set of test stimuli to a second predefined number of consecutive wafer sites in said row following the first predefine number of wafer sites;
(c) in the event that no defective wafer sites are identified in the first and second predefined number of wafer sites, repeating steps (a)-(c) until a defective wafer sites is identified;
(d) in the event that a defective wafer site is identified, applying a full set of test stimuli to wafer sites subsequent to the defective wafer site until a third predefined number of consecutive non-defective wafer sites has been identified; and
(e) after the third predefined number of consecutive non-defective wafer sites has been identified, resume repeating steps (a)-(c).

2. A method as in claim 1, and wherein one or more regions of the wafer are designated as full test regions in which all wafer sites located in said one or more regions have a full set of test stimuli applied thereto.

3. A method as in claim 1, and wherein each wafer site consists of one integrated circuit die.

4. A method as in claim 1, and wherein each wafer site includes a plurality of integrated circuit die.

* * * * *